United States Patent
Chen et al.

(10) Patent No.: US 8,427,243 B2
(45) Date of Patent: Apr. 23, 2013

(54) SIGNAL GENERATING CIRCUIT AND SIGNAL GENERATING METHOD

(75) Inventors: Hsin-Hung Chen, Hsinchu County (TW); Hsiang-Hui Chang, Miaoli County (TW)

(73) Assignee: Mediatek Inc., Science-Based Industrial Park, Hsin-Chu (TW)

( * ) Notice: Subject to any disclaimer, the term of this patent is extended or adjusted under 35 U.S.C. 154(b) by 150 days.

(21) Appl. No.: 13/029,130

(22) Filed: Feb. 17, 2011

(65) Prior Publication Data

US 2012/0212296 A1    Aug. 23, 2012

(51) Int. Cl.
*H03B 19/00* (2006.01)
(52) U.S. Cl.
USPC ............ 331/1 A; 331/34; 331/16; 331/177 R; 327/156; 327/159
(58) Field of Classification Search ................... 331/1 A, 331/16, 34, 25; 327/156, 159
See application file for complete search history.

(56) References Cited

U.S. PATENT DOCUMENTS 8,031,007 B2 * 10/2011 Chang et al. .................. 331/1 A
2008/0007346 A1   1/2008 Jensen et al.

* cited by examiner

*Primary Examiner* — Arnold Kinkead
(74) *Attorney, Agent, or Firm* — Winston Hsu; Scott Margo

(57) ABSTRACT

A signal generating circuit includes: an operating circuit arranged to generate a first control signal according to a reference clock signal and a feedback oscillating signal; a controllable oscillator arranged to generate an output oscillating signal according to the first control signal and a second control signal; a feedback circuit arranged to generate the feedback oscillating signal according to the output oscillating signal and a third control signal; a control circuit arranged to generate the second control signal and the third control signal according to an input signal; and a calibrating circuit arranged to calibrate the control circuit to adjust the second control signal by detecting a phase difference between the reference clock signal and the feedback oscillating signal.

27 Claims, 6 Drawing Sheets

SIGNAL GENERATING CIRCUIT AND SIGNAL GENERATING METHOD

BACKGROUND

The present invention relates to a signal generating circuit and a related method, and more particularly to a modulator capable of calibrating a gain mismatch of a controllable oscillator in the modulator and a related method.

Conventionally, a two-point modulator (TPM) is a low-complexity implementation of a transmitter concept for transceivers in mobile radio systems. The two-point modulator generally comprises a phase-locked loop (PLL) circuit, a low-pass modulating path, and a high-pass modulating path, in which the input modulation data is fed to the phase-locked loop circuit via the low-pass modulating path and the high-pass modulating path. Generally, the low-pass modulating path is connected to the feedback divider of the phase-locked loop circuit, and the high-pass modulating path is connected to the voltage-controlled oscillator (VCO) of the phase-locked loop circuit. Ideally, the two-point modulator has an all-pass response from the input modulation data to the output signal of the voltage-controlled oscillator, so that the phase-locked loop circuit has a transmission response which is independent of frequency. However, as the gain of the voltage-controlled oscillator is a variable parameter with respect to the frequency, the voltage-controlled oscillator may induce a gain mismatch when the frequency band of the transmitted output signal is changed. In other words, the frequency response of the two-point modulator deteriorates when the two-point modulator is used to transmit a multi-band output signal. Therefore, providing an efficient way to detect and calibrate the gain mismatch problem that emerges in the two-point modulator is a significant concern in the mobile radio field.

SUMMARY OF THE INVENTION

One of the objectives is to therefore provide a modulator capable of calibrating a gain mismatch of a controllable oscillator in the modulator and to provide a related method.

According to a first embodiment of the present invention, a signal generating circuit is provided. The signal generating circuit comprises an operating circuit, a controllable oscillator, a feedback circuit, a control circuit, and a calibrating circuit. The operating circuit is arranged to generate a first control signal according to a reference clock signal and a feedback oscillating signal. The controllable oscillator is arranged to generate an output oscillating signal according to the first control signal and a second control signal. The feedback circuit is arranged to generate the feedback oscillating signal according to the output oscillating signal and a third control signal. The control circuit is arranged to generate the second control signal and the third control signal according to an input signal. The calibrating circuit is arranged to calibrate the control circuit to adjust the second control signal by detecting a phase difference between the reference clock signal and the feedback oscillating signal.

According to a second embodiment of the present invention, another signal generating circuit is provided. The signal generating circuit comprises an operating circuit, a controllable oscillator, a feedback circuit, a sigma-delta modulator, and a detecting circuit. The operating circuit is arranged to generate a first control signal according to a reference clock signal and a feedback oscillating signal. The controllable oscillator is arranged to generate an output oscillating signal according to the first control signal. The feedback circuit is arranged to generate the feedback oscillating signal according to the output oscillating signal and a second control signal. The sigma-delta modulator is arranged to generate the second control signal. The first detecting circuit is arranged to detect a phase difference between the reference clock signal and the feedback oscillating signal to generate a first detecting signal utilized for estimating a gain of the controllable oscillator when an input signal is inputted to the signal generating circuit.

According to a third embodiment of the present invention, a device for estimating a gain of a controllable oscillator operated in a phase locked loop (PLL) is provided. The device comprises a testing signal generator and a time-to-digital converter (TDC). The testing signal generator is arranged to inject a testing signal into the phase locked loop. The time-to-digital converter (TDC) is arranged to convert a phase difference between a reference clock signal and a feedback oscillating signal of the phase locked loop to a digital represented value for estimating the gain of the controllable oscillator, wherein the reference clock signal and the feedback oscillating signal are derived after the injection of the testing signal.

According to a fourth embodiment of the present invention, a method for estimating a gain of a controllable oscillator operated in a phase locked loop (PLL) is provided. The method comprises the following steps: injecting a testing signal into the phase locked loop; and converting a phase difference between a reference clock signal and a feedback oscillating signal of the phase locked loop to a digital represented value for estimating the gain of the controllable oscillator, wherein the reference clock signal and the feedback oscillating signal are derived after the injection of the testing signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
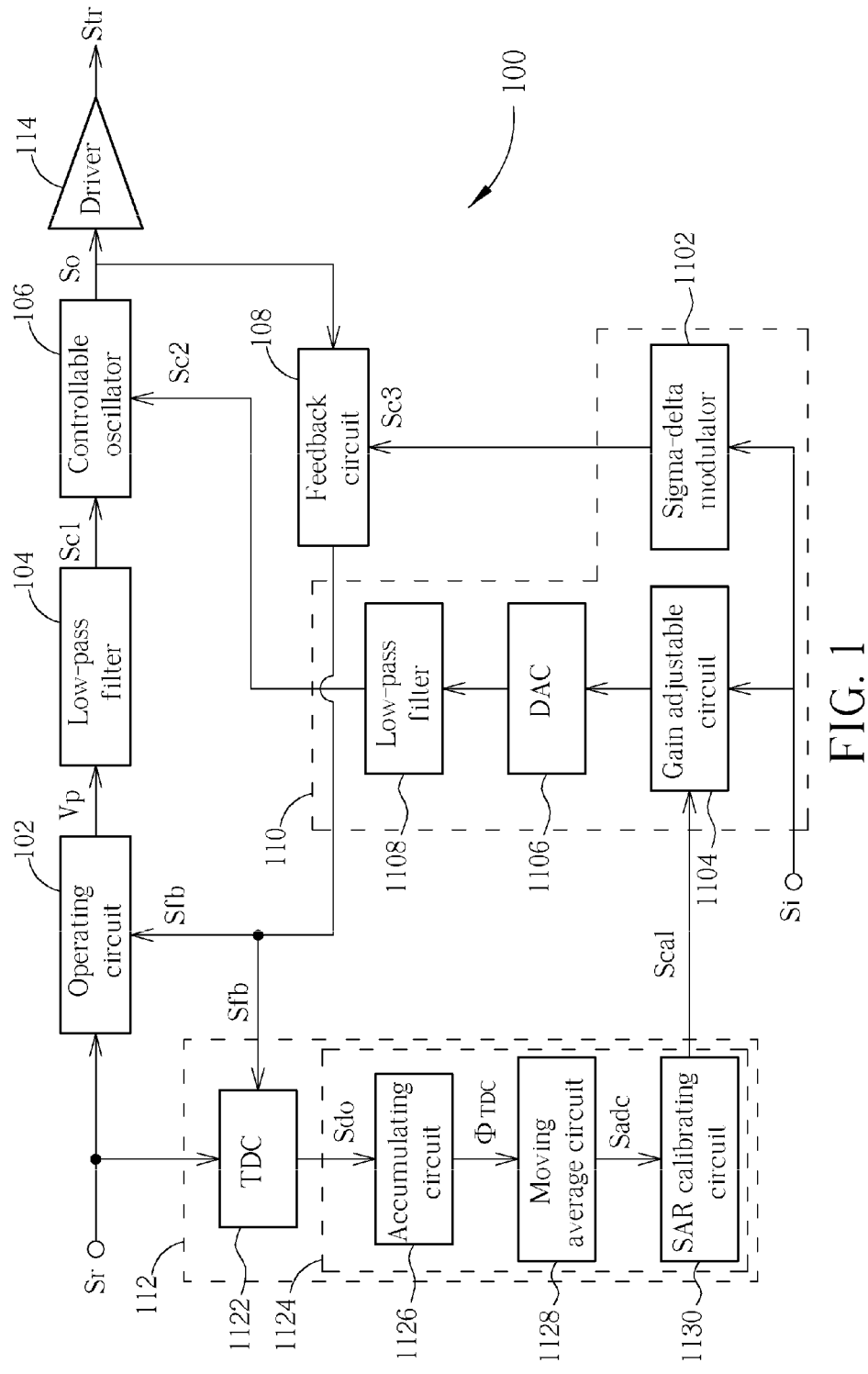
FIG. 1 is a diagram illustrating a signal generating circuit according to a first embodiment of the present invention.

FIG. 1 is a diagram illustrating a signal generating circuit 100 according to a first embodiment of the present invention. More specifically, the signal generating circuit 100 is a signal modulating circuit which can be implemented as a wireless transmitter in mobile radio systems. The signal generating circuit 100 can be a two-point modulator (TPM) which comprises an operating circuit 102, a low-pass filter 104, a controllable oscillator 106, a feedback circuit 108, a control circuit 110, a calibrating circuit 112, and a driver 114. The operating circuit 102, which can be a phase/frequency detector and a charge pump circuit (PFD/CP), is arranged to receive a reference clock signal Sr and a feedback oscillating signal Sfb and generate a first control signal Sc1 according to the reference clock signal Sr and the feedback oscillating signal Sfb. The controllable oscillator 106 is arranged to generate an output oscillating signal So according to the first control signal Sc1 and a second control signal Sc2. The low-pass filter 104 is coupled between the operating circuit 102 and the controllable oscillator 106, in which the low-pass filter 104 filters out the unwanted signal of the output signal $v_p$ of the operating circuit 102 and generates the first control signal Sc1 to the controllable oscillator 106. The feedback circuit 108, which can be a frequency divider, is arranged to generate the feedback oscillating signal Sfb according to the output oscillating signal So and a third control signal Sc3. The control circuit 110 is arranged to generate the second control signal Sc2 and the third control signal Sc3 according to an input signal Si. The calibrating circuit 112 is arranged to calibrate the control circuit 110 to adjust the second control signal Sc2 by detecting a difference Td between the reference clock signal Sr and the feedback oscillating signal Sfb, in which the difference Td is the time difference caused by the phase difference between the reference clock signal Sr and the feedback oscillating signal Sfb. The driver 114 is employed to drive the output oscillating signal So to generate a transmitting signal Str.

The control circuit 110 comprises two circuit paths, wherein one is the low-pass modulating path, and the other is the high-pass modulating path. More specifically, the low-pass modulating path comprises a sigma-delta modulator 1102, which is arranged to generate the third control signal Sc3 according to the input signal Si. The high-pass modulating path is a converting circuit arranged to generate the second control signal Sc2 according to the input signal Si, wherein the converting circuit comprises a gain adjustable circuit 1104, a digital-to-analog converter (DAC) 1106, and a low-pass filter 1108. The gain adjustable circuit 1104 is arranged to provide an adjustable gain controlled by the calibrating circuit 112. The gain adjustable circuit 1104 may be a separate block or implemented in the digital-to-analog converter 1106. More specifically, for example, when the controllable oscillator 106 is a voltage-controlled oscillator (VCO), the gain adjustable circuit 1104 may be implemented to merge with the digital-to-analog converter 1106, when the controllable oscillator 106 is a digital-controlled oscillator (DCO), the gain adjustable circuit 1104 may be a single block device. The digital-to-analog converter 1106 is arranged to convert the input signal Si into the second control signal Sc2. It should be noted that the total gain of the converting circuit includes the adjustable gain provided by the gain adjustable circuit 1104, the gain provided by the digital-to-analog converter 1106, and the gain provided by the low-pass filter 1108.

In addition, in this preferred embodiment, the adjustable gain of the gain adjustable circuit 1104 is represented as $K_{cal}$, and the gain of the digital-to-analog converter 1106 in conjunction with the low-pass filter 1108 is represented as $K_H$ for brevity.

Furthermore, the calibrating circuit 112 comprises a time-to-digital converter (TDC) 1122 and an adjusting circuit 1124. The time-to-digital converter 1122 is arranged to convert the difference Td to a digital represented value Sdo. The adjusting circuit 1124 is arranged to calibrate the gain of the converting circuit according to the digital represented value Sdo. In this preferred embodiment, the adjusting circuit 1124 comprises an accumulating circuit 1126, a moving average circuit 1128, and a successive approximation register (SAR) calibrating unit 1130. The accumulating circuit 1126 is arranged to accumulate an output, e.g., the digital represented value Sdo, of the time-to-digital converter 1122 to generate an accumulated digital represented value $\phi_{TDC}$. The moving average circuit 1128 is arranged to perform a moving average operation upon the accumulated digital represented value $\phi_{TDC}$ to generate an averaged digital represented value Sadc. The successive approximation register calibrating unit 1130 is arranged to generate a calibrating signal Scal to the gain adjustable circuit 1104 of the converting circuit for successively adjusting the second control signal Sc2 according to the accumulated digital represented value $\phi_{TDC}$.

When the signal generating circuit 100 is enabled, the phase-locked loop circuit, which is composed of the operating circuit 102, the low-pass filter 104, the controllable oscillator 106, and the feedback circuit 108, locks the phases of the reference clock signal Sr and the feedback oscillating signal Sfb to generate the output oscillating signal So. Then, when the phase-locked loop circuit is stable, a testing signal (i.e., the input signal Si) is generated to be input to the control circuit 110 for calibrating the gain mismatch caused by the controllable oscillator 106. It should be noted that the input signal Si is a step signal represented in digital, and the input signal Si is represented by a frequency step $\Delta f$. Once the digital the input signal Si is inputted to the control circuit 110, the phase-locked loop circuit re-locks the phases of the reference clock signal Sr and the feedback oscillating signal Sfb to update the output oscillating signal So. Then, the calibrating circuit 112 detects the difference Td between the reference clock signal Sr and the feedback oscillating signal Sfb and generates the calibrating signal Scal to successively adjust the gain $K_{cal}$ of the gain adjustable circuit 1104 until the accumulated digital represented value $\phi_{TDC}$ (i.e., the accumulated differences between the reference clock signal Sr and the feedback oscillating signal Sfb) is substantially equal to zero. In this preferred embodiment, the phase difference of the output oscillating signal So before and after the update is represented by $\phi_{vco}$, therefore the phase difference $\phi_{vco}$ can be illustrated by the following equation (1):

$$\phi_{vco} = \frac{K_{cal} \cdot K_H \cdot K_v}{s} \cdot \Delta f + \left(\frac{1}{sN}\Delta f - \frac{\phi_{vco}}{N}\right) \cdot K_P \cdot G_{LPF}(s) \cdot \frac{K_v}{s} \quad (1)$$

$$= \frac{\frac{K_{cal} \cdot K_H \cdot K_v}{s} + \frac{K_P \cdot G_{LPF}(s) \cdot K_v}{s^2 N}}{1 + \frac{K_P \cdot G_{LPF}(s) \cdot K_v}{sN}} \cdot \Delta f;$$

wherein $K_v$ represents the gain of the controllable oscillator 106, $K_P$ represents the gain of the operating circuit 102, e.g., the PFD/CP, $G_{LPF}(s)$ represents the gain of the low-pass filter 104, and N is the divisor of the frequency divider, i.e., the feedback circuit 108. When the phase difference $\phi_{vco}$ of the output oscillating signal So is obtained, the output frequency $f_{vco}$ of the output oscillating signal So can also be obtained by the following equation (2):

$$f_{vco} = s \cdot \phi_{vco} = \frac{K_{cal} \cdot K_H \cdot K_v + \frac{K_P \cdot G_{LPF}(s) \cdot K_v}{sN}}{1 + \frac{K_P \cdot G_{LPF}(s) \cdot K_v}{sN}} \cdot \Delta f. \quad (2)$$

Furthermore, the output signal $v_p$ of the operating circuit 102 can be obtained by the following equation (3):

$$v_p = \left(\frac{\Delta f}{sN} - \frac{\phi_{vco}}{N}\right) \cdot K_P \quad (3)$$

$$= \frac{1}{sN}(\Delta f - s \cdot \phi_{vco}) \cdot K_P$$

$$= \frac{\Delta f}{sN}\left(\frac{1 - K_{cal} \cdot K_H \cdot K_v}{1 + \frac{K_P \cdot G_{LPF}(s) \cdot K_v}{sN}}\right) \cdot K_P$$

$$= \frac{\Delta f (1 - K_{cal} \cdot K_H \cdot K_v) \cdot K_P}{sN + K_P \cdot G_{LPF}(s) \cdot K_v}.$$

As the output signal $v_p$ represents the difference Td between the reference clock signal Sr and the feedback oscillating signal Sfb, the accumulated digital represented value $\phi_{TDC}$ can also be represented by the output signal $v_p$ as the following equation (4):

$$\phi_{TDC} = \frac{v_p}{K_P} \cdot \frac{K_{TDC}}{s} \quad (4)$$

$$= \frac{\Delta f (1 - K_{cal} \cdot K_H \cdot K_v) \cdot K_{TDC}}{s^2 N + s \cdot K_P \cdot G_{LPF}(s) \cdot K_v},$$

$$\Delta f = \frac{\Delta f_0}{s}, G_{LPF}(s) = \frac{1}{s};$$

$$\lim_{s \to 0} (s \cdot \phi_{TDC}) = (1 - K_{cal} \cdot K_H \cdot K_v) \cdot \frac{K_{TDC}}{K_P \cdot K_v} \cdot \Delta f_0 \quad (5)$$

$$\Rightarrow 1 = K_{cal} \cdot K_H \cdot K_v;$$

wherein $K_{TDC}$ represents the gain of the time-to-digital converter (TDC) 1122.

Then, the condition of the accumulated digital represented value $\phi_{TDC}$ being substantially equal to zero is when the value of $s \cdot \phi_{TDC}$ substantially equals zero. Therefore, according to the equation (5), when $K_{cal} \cdot K_H \cdot K_v = 1$, the accumulated digital represented value TDC is substantially equal to zero. In other words, the calibrating circuit 112 adjusts the gain $K_{cal}$ of the gain adjustable circuit 1104 until $K_{cal} \cdot K_H \cdot K_v = 1$ to calibrate the gain mismatch of the controllable oscillator 106.

Figure 2:
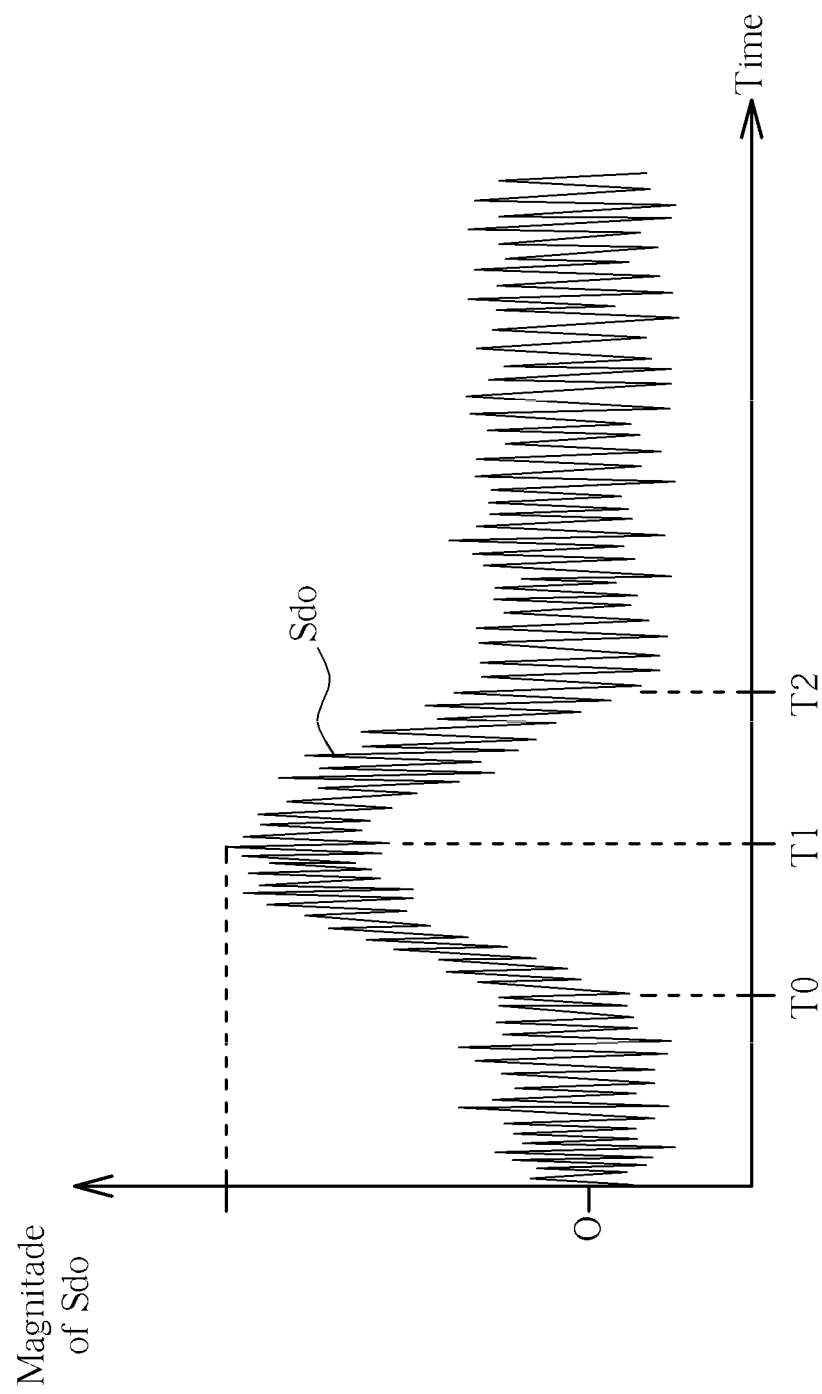
FIG. 2 is a timing diagram illustrating the magnitudes of a digital represented value when an input signal is inputted to the signal generating circuit shown in FIG. 1.
Figure 3:
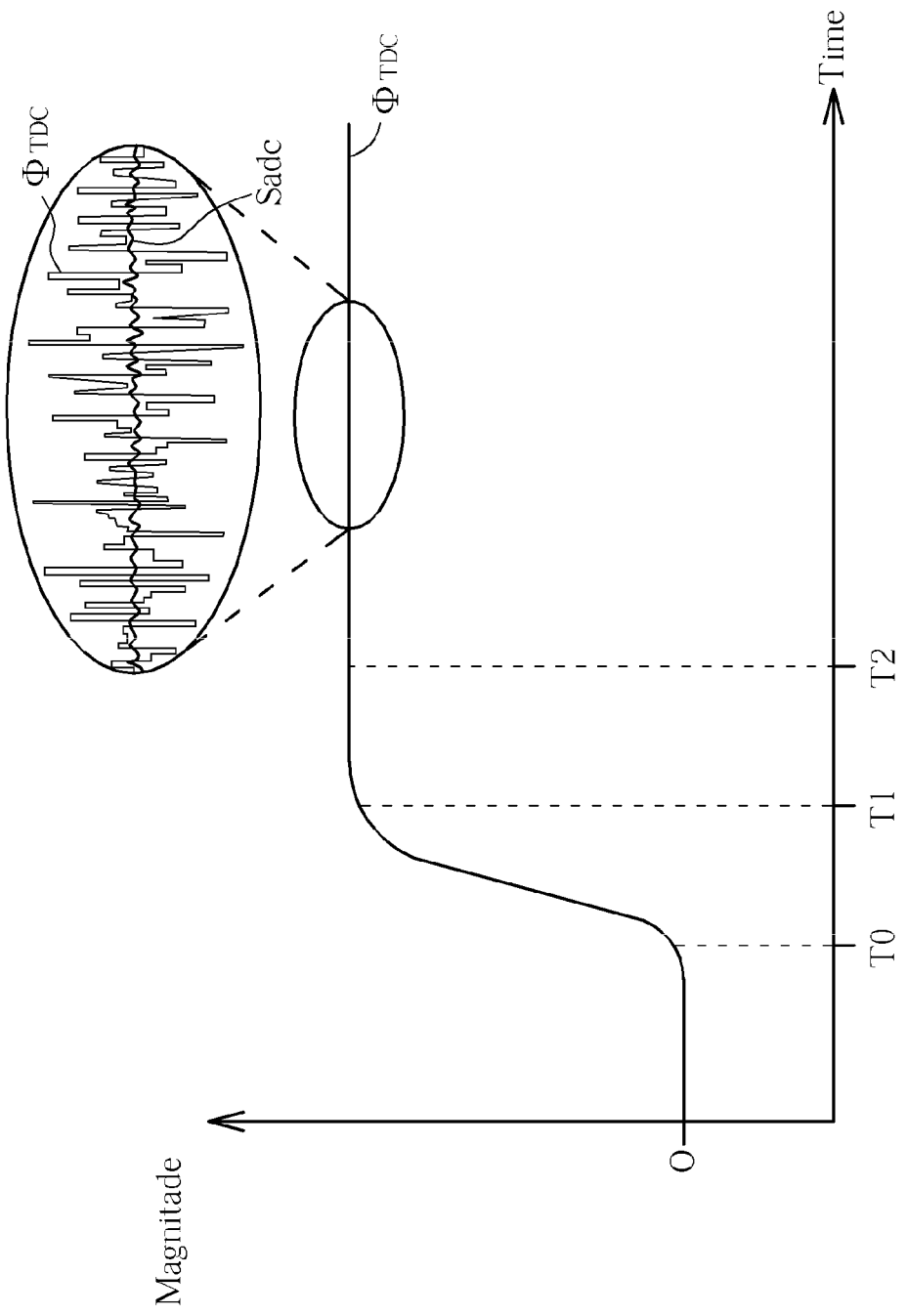
FIG. 3 is a timing diagram illustrating an accumulated digital represented value of the signal generating circuit shown in FIG. 1.

More specifically, when the input signal Si is inputted to the control circuit 110, the controllable oscillator 106 and the feedback circuit 108 are updated by the second control signal Sc2 and the third control signal Sc3 respectively. Then, the phase of the feedback oscillating signal Sfb is changed when a gain mismatch emerges in the controllable oscillator 106. Accordingly, the time-to-digital converter 1122 as well as the operating circuit 102 detects a phase error, i.e., the time difference Td, between the reference clock signal Sr and the updated feedback oscillating signal Sfb to generate the digital represented value Sdo as shown in FIG. 2. FIG. 2 is a timing diagram illustrating the magnitudes of the digital represented value Sdo when the input signal Si is inputted to the signal generating circuit 100. It should be noted that the digital represented value Sdo outputted from the time-to-digital converter 1122 are a set of digital-based values but not the analog signal as shown in FIG. 2. According to FIG. 2, the magnitude of the digital represented value Sdo suddenly increases to reach a maximum value at time T1 after the input signal Si is inputted to the signal generating circuit 100 at time T0. Then, the phase-locked loop circuit re-locks the phases between the reference clock signal Sr and the updated feedback oscillating signal Sfb until the magnitude of the digital represented value Sdo reaches around zero at time T2 again. Meanwhile, the accumulating circuit 1126 accumulates the digital represented value Sdo outputted from the time-to-digital converter 1122 to generate the accumulated digital represented value $\phi_{TDC}$ as shown in FIG. 3. This is because the accumulated phase error (i.e., the accumulated digital represented value $\phi_{TDC}$) is proportional to the gain mismatch of the controllable oscillator 106.

FIG. 3 is a timing diagram illustrating the accumulated digital represented value $\phi_{TDC}$ of the signal generating circuit 100. It should be noted that the sign of the accumulated digital represented value $\phi_{TDC}$ can be used to distinguish if the phase of the reference clock signal Sr leads the phase of the updated feedback oscillating signal Sfb or the phase of the reference clock signal Sr lags behind the phase of the updated feedback oscillating signal Sfb. In this example, the accumulated digital represented value $\phi_{TDC}$ is a positive value, which means that the phase of the reference clock signal Sr leads the phase of the updated feedback oscillating signal Sfb. Otherwise, the accumulated digital represented value $\phi_{TDC}$ is a negative value, meaning that the phase of the reference clock signal Sr lags behind the phase of the updated feedback oscillating signal Sfb. Therefore, by determining the sign and the magnitude of the accumulated digital represented value $\phi_{TDC}$, the successive approximation register calibrating unit 1130 is able to determine how much the phase of the reference clock signal Sr leads the phase of the updated feedback oscillating signal Sfb or how much the phase of the reference clock signal Sr lags behind the phase of the updated feedback oscillating signal Sfb. Then, by using the accumulated digital represented value $\phi_{TDC}$, the successive approximation register calibrating unit 1130 adjusts the gain $K_{cal}$ of the gain adjustable circuit 1104 to make the phase of the updated feedback oscillating signal Sfb catch up with the phase of the reference clock signal Sr when the phase of the reference clock signal Sr leads the phase of the updated feedback oscillating signal Sfb, or to slow down the phase of the updated feedback oscillating signal Sfb when the phase of the reference clock signal Sr lags behind the phase of the updated feedback oscillating signal Sfb. Therefore, by successively adjusting the gain $K_{cal}$ of the gain adjustable circuit 1104, the phase of the reference clock signal Sr will finally align with the phase of the updated feedback oscillating signal Sfb. In other words, when the phase of the reference clock signal Sr aligns with the phase of the updated feedback oscillating signal Sfb, the value of $K_{cal} \cdot K_H \cdot K_v$ is substantially equal to one, i.e., $K_{cal} \cdot K_H \cdot K_v = 1$.

Please refer to FIGS. 2 and 3 again. As the magnitude of the digital represented value Sdo varies constantly in a specific range, the accumulated digital represented value $\phi_{TDC}$ also varies constantly making the accumulated digital represented value $\phi_{TDC}$ not be a smooth signal as shown in the zoom-in area in FIG. 3. If the accumulated digital represented value $\phi_{TDC}$ varies constantly, the calibrating signal Scal output by the successive approximation register calibrating unit 1130 also varies constantly. As a result, the phase of the reference clock signal Sr will not accurately align with the phase of the updated feedback oscillating signal Sfb if the accumulated digital represented value $\phi_{TDC}$ is not a smooth signal. To make the accumulated digital represented value $\phi_{TDC}$ be a smooth signal, the moving average circuit 1128 is introduced to perform the moving average operation upon the accumulated digital represented value $\phi_{TDC}$ to generate the averaged digital represented value Sadc. In the zoom-in area in FIG. 3, the variation of the averaged digital represented value Sadc is reduced substantially to make the averaged digital represented value Sadc much smoother than the accumulated digital represented value $\phi_{TDC}$. Then, the successive approximation register calibrating unit 1130 receives the averaged digital represented value Sadc instead of the accumulated digital represented value $\phi_{TDC}$ to generate the calibrating signal Scal for adjusting the gain $K_{cal}$ of the gain adjustable circuit 1104.

Please note that, according to the above preferred embodiment, both the time-to-digital converter 1122 and an adjusting circuit 1124 are digital based circuits. Furthermore, both the moving average circuit 1128 and the successive approximation register calibrating unit 1130 can be optional devices in the above embodiment. In other words, through the appropriate modifications, the moving average circuit 1128 and the successive approximation register calibrating unit 1130 can be replaced by any other devices having similar functions, and these modifications also belong to the scope of the present invention.

Briefly, the method of the loop gain of the phase-locked loop circuit in the signal generating circuit 100 can be summarized into the following steps S102-S108:

Step S102: Arrange the operating circuit 102 to receive the reference clock signal Sr and the feedback oscillating signal Sfb and generate the first control signal Sc1 according to the reference clock signal Sr and the feedback oscillating signal Sfb;

Step S104: Arrange the controllable oscillator 106 to generate the output oscillating signal So according to the first control signal Sc1 and the second control signal Sc2;

Step S106: Arrange the feedback circuit 108 to generate the feedback oscillating signal Sfb according to the output oscillating signal So and the third control signal Sc3;

Step S108: Arrange the control circuit 110 to generate the second control signal Sc2 and the third control signal Sc3 according to the input signal Si; and Step S108: Calibrate the control circuit 110 to adjust the second control signal Sc by detecting the difference Td between the reference clock signal Sr and the feedback oscillating signal Sfb.

Figure 4:
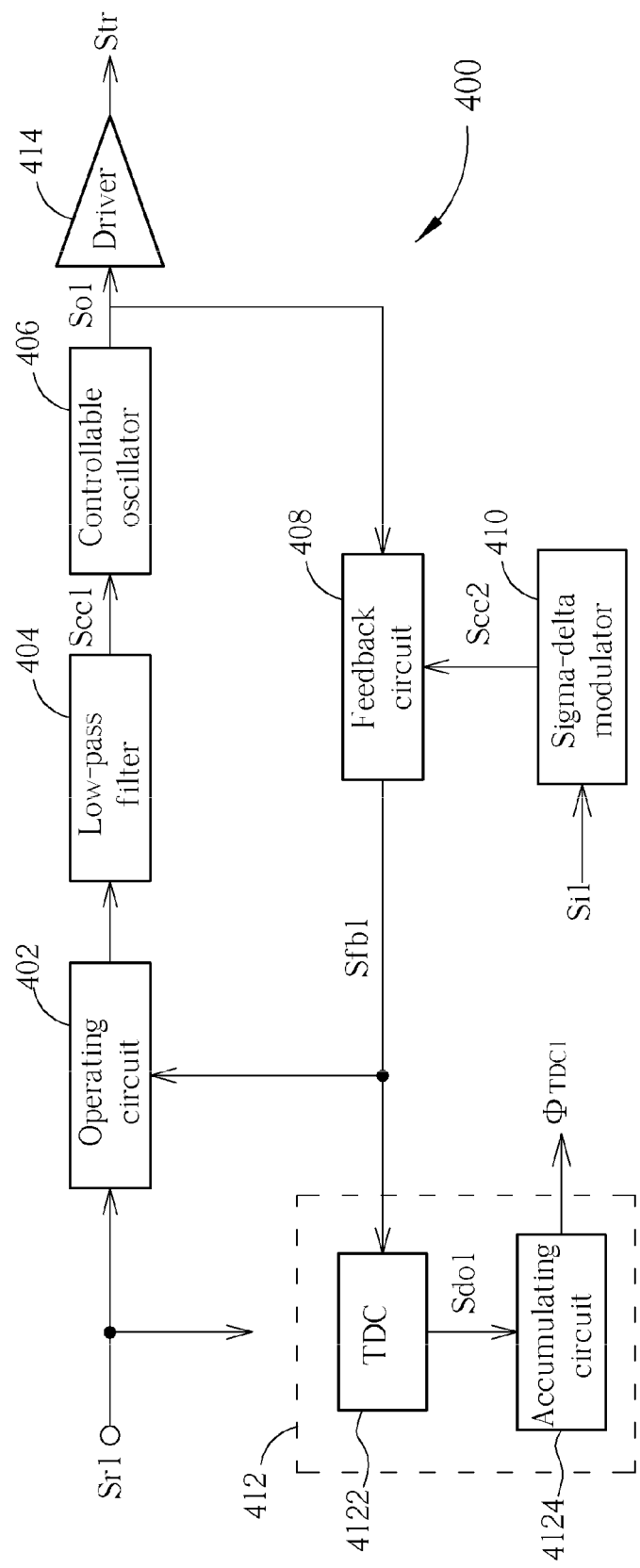
FIG. 4 is a diagram illustrating a phase-locked loop circuit according to a second embodiment of the present invention.

In addition, according to the ideas disclosed in the above preferred embodiment, the signal generating circuit 100 can also be modified for a phase-locked loop circuit for estimating a gain of the controllable oscillator in the phase-locked loop circuit as shown in FIG. 4. FIG. 4 is a diagram illustrating a phase-locked loop circuit 400 according to a second embodiment of the present invention. The phase-locked loop circuit 400 comprises an operating circuit 402, a low-pass filter 404, a controllable oscillator 406, a feedback circuit 408, a sigma-delta modulator 410, a detecting circuit 412, and a driver 414. The operating circuit 402, which can be a phase/frequency detector and a charge pump circuit (PFD/CP), is arranged to receive a reference clock signal Sr1 and a feedback oscillating signal Sfb1 and generate a first control signal Scc1 according to the reference clock signal Sr1 and the feedback oscillating signal Sfb1. The controllable oscillator 406 is arranged to generate an output oscillating signal So1 according to the first control signal Scc1. The low-pass filter 404 is coupled between the operating circuit 402 and the controllable oscillator 406, in which the low-pass filter 404 filters out the unwanted signal of the output signal of the operating circuit 402 and generates the first control signal Scc1 to the controllable oscillator 406. The feedback circuit 408, which can be a frequency divider, is arranged to generate the feedback oscillating signal Sfb1 according to the output oscillating signal So1 and a second control signal Scc2. The sigma-delta modulator 410 is arranged to generate the second control signal Scc2 according to an input signal Si1. The detecting circuit 412 is arranged to detect a difference Td1 between the reference clock signal Sr1 and the feedback oscillating signal Sfb1 to generate a detecting signal utilized for estimating a gain $K_{v1}$ of the controllable oscillator 406, in which the difference Td1 is the time difference caused by the phase difference between the reference clock signal Sr1 and the feedback oscillating signal Sfb1.

In addition, the detecting circuit 412 comprises a time-to-digital converter (TDC) 4122 and an accumulating circuit 4124. The time-to-digital converter 4122 is arranged to convert the difference Td1 to a digital represented value Sdo1. The accumulating circuit 4124 is arranged to accumulate the digital represented value Sdo1 outputted from the time-to-digital converter 4122 to generate an accumulated digital represented value $\phi_{TDC1}$, i.e., the above-mentioned detecting signal.

When the phase-locked loop circuit 400 is enabled, the phase-locked loop circuit 400 locks the phases of the reference clock signal Sr1 and the feedback oscillating signal Sfb1 to generate the output oscillating signal So1. Then, when the phase-locked loop circuit 400 is stable, a testing signal (i.e., the input signal Si1) is generated to be input to the sigma-delta modulator 410 for estimating the gain $K_{v1}$ of the controllable oscillator 406. It should be noted that the input signal Si1 is a step signal represented in digital, and the input signal Si1 is represented by a frequency step $\Delta f1$. Once the input signal Si1 is inputted to the sigma-delta modulator 410, the divisor N1 of the frequency divider, i.e., the feedback circuit 408, is updated by the input signal Si1. Then, the phase-locked loop circuit 400 re-locks the phases of the reference clock signal Sr1 and the feedback oscillating signal Sfb1 to update the output oscillating signal So1. In other words, the accumulated digital represented value $\phi_{TDC1}$ includes the information of the gain $K_{v1}$ of the controllable oscillator 406. It should be noted that the input signal Si1 is a known signal in this preferred embodiment. Therefore, the gain $K_{v1}$ of the controllable oscillator 406 can be obtained according to the input signal Si1 and the accumulated digital represented value $\phi_{TDC1}$.

When the gain $K_{v1}$ of the controllable oscillator 406 is obtained, the loop gain of the phase-locked loop circuit 400 is also obtained. In other words, when the gain mismatch of the controllable oscillator 406 occurs to make the loop gain of the phase-locked loop circuit 400 deviate from the desired value, the loop gain of the phase-locked loop circuit 400 can be calibrated to the desired value according to the accumulated digital represented value $\phi_{TDC1}$ and the input signal Si1. It should be noted that the preferred embodiment is not limited to the way of calibrating the loop gain of the phase-locked loop circuit 400. For example, in one embodiment of the present invention, a calibrating circuit can be used to receive the accumulated digital represented value $\phi_{TDC1}$ and the input signal Si1 and accordingly generate a calibrating signal to adjust the gain of the operating circuit 402 or the gain of the low-pass filter 404 for calibrating the loop gain of the phase-locked loop circuit 400. As the operation of the time-to-digital converter 4122 and the accumulating circuit 4124 are similar to the above-mentioned time-to-digital converter 1122 and the accumulating circuit 1126, the detailed description is omitted here for brevity. In addition, both the time-to-digital converter 4122 and an accumulating circuit 4124 are also digital based circuits.

Briefly, the method of estimating the gain $K_{v1}$ of the controllable oscillator 406 in the phase-locked loop circuit 400 can be summarized into the following steps S402-S408:

Step S402: Arrange the operating circuit 402 to receive the reference clock signal Sr1 and the feedback oscillating signal Sfb1 and generate the first control signal Scc1 according to the reference clock signal Sr1 and the feedback oscillating signal Sfb1;

Step S404: Arrange the controllable oscillator 406 to generate the output oscillating signal So1 according to the first control signal Scc1;

Step S406: Arrange the feedback circuit 408 to generate the feedback oscillating signal Sfb1 according to the output oscillating signal So1 and the second control signal Scc2;

Step S408: Arrange the sigma-delta modulator 410 to generate the second control signal Scc2 according to the input signal Si1; and Step S410: Detect the difference Td1 between the reference clock signal Sr1 and the feedback oscillating signal Sfb1 to generate the detecting signal utilized for estimating the gain $K_{v1}$ of the controllable oscillator 406.

Figure 5:
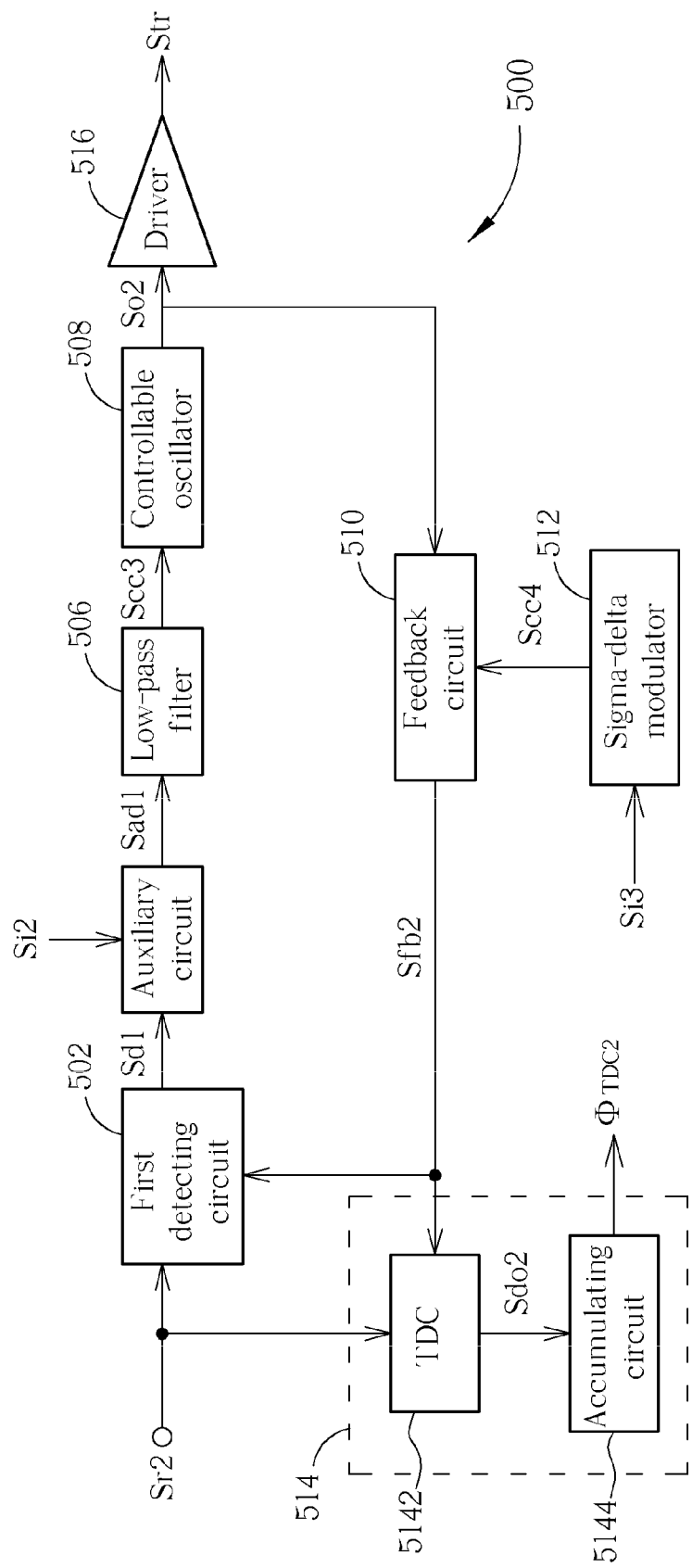
FIG. 5 is a diagram illustrating a phase-locked loop circuit according to a third embodiment of the present invention.

FIG. 5 is a diagram illustrating a phase-locked loop circuit 500 according to a third embodiment of the present invention. The phase-locked loop circuit 500 comprises a first detecting circuit 502, an auxiliary circuit 504, a low-pass filter 506, a controllable oscillator 508, a feedback circuit 510, a sigma-delta modulator 512, a second detecting circuit 514, and a driver 516. The first detecting circuit 502, which can be a phase/frequency detector and a charge pump circuit (PFD/CP), is arranged to receive a reference clock signal Sr2 and a feedback oscillating signal Sfb2 and generate a first detect signal Sd1 according to the reference clock signal Sr2 and the feedback oscillating signal Sfb2. The auxiliary circuit 504 is arranged to adjust the first detect signal Sd1 according to a first input signal Si2 to generate an adjusted detect signal Sad1. The low-pass filter 506 is arranged to filter out the unwanted signal of the adjusted detect signal Sad1 to generate a first control signal Scc3. The controllable oscillator 508 is arranged to generate an output oscillating signal So2 according to the first control signal Scc3. The feedback circuit 510, which can be a frequency divider, is arranged to generate the feedback oscillating signal Sfb2 according to the output oscillating signal So2 and a second control signal Scc4. The sigma-delta modulator 512 is arranged to generate the second control signal Scc4 according to a second input signal Si3. The detecting circuit 514 is arranged to detect a difference Td2 between the reference clock signal Sr2 and the feedback oscillating signal Sfb2 to generate a detecting signal utilized for estimating a gain $K_{v2}$ of the controllable oscillator 508, in which the difference Td2 is the time difference caused by the phase difference between the reference clock signal Sr2 and the feedback oscillating signal Sfb2.

In addition, the detecting circuit 514 comprises a time-to-digital converter (TDC) 5142 and an accumulating circuit 5144. The time-to-digital converter 5142 is arranged to convert the difference Td2 to a digital represented value Sdo2. The accumulating circuit 5144 is arranged to accumulate the digital represented value Sdo2 outputted from the time-to-digital converter 5142 to generate an accumulated digital represented value $\phi_{TDC2}$, i.e., the above-mentioned detecting signal.

When the phase-locked loop circuit 500 is enabled, the phase-locked loop circuit 500 locks the phases of the reference clock signal Sr2 and the feedback oscillating signal Sfb2 to generate the output oscillating signal So2 according to the second input signal Si3. Then, when the phase-locked loop circuit 500 is stable, a testing signal (i.e., the first input signal Si2) is generated to be input to the auxiliary circuit 504 for estimating the gain $K_{v2}$ of the controllable oscillator 508. It should be noted that the first input signal Si2 is a step signal represented in digital, and the first input signal Si2 is represented by a frequency step $\Delta f2$. Once the first input signal Si2 is inputted to the auxiliary circuit 504, the adjusted detect signal Sad1 is updated and the voltage level of the first control signal Scc3 is updated accordingly. Similarly, the phase (or the frequency) of the output oscillating signal So2 and the feedback oscillating signal Sfb2 are updated. Then, the phase-locked loop circuit 500 re-locks the phases of the reference clock signal Sr2 and the feedback oscillating signal Sfb2 to update the output oscillating signal So2. In other words, the accumulated digital represented value $\phi_{TDC2}$ includes the information of the gain $K_{v2}$ of the controllable oscillator 508. It should be noted that the first input signal Si2 is a known current signal in this preferred embodiment. Therefore, the gain $K_{v2}$ of the controllable oscillator 508 can be obtained according to the first input signal Si2 and the accumulated digital represented value $\phi_{TDC2}$.

According to the teachings of the second preferred embodiment, when the gain $K_{v2}$ of the controllable oscillator 508 is obtained, the loop gain of the phase-locked loop circuit 500 is also obtained. Then, if the gain mismatch of the controllable oscillator 506 occurs to make the loop gain of the phase-locked loop circuit 500 deviate from the desired value, the loop gain of the phase-locked loop circuit 500 can be calibrated to the desired value according to the accumulated digital represented value $\phi_{TDC2}$ and the first input signal Si2. Similarly, the preferred embodiment is not limited to the way of calibrating the loop gain of the phase-locked loop circuit 500. For example, in one embodiment of the present invention, a calibrating circuit can be used to receive the accumulated digital represented value $\phi_{TDC2}$ and the first input signal Si2 and accordingly generate a calibrating signal to adjust the gain of the first detecting circuit 502 or the gain of the low-pass filter 506 for calibrating the loop gain of the phase-locked loop circuit 500. As the operation of the time-to-digital converter 5142 and the accumulating circuit 5144 are similar to the above-mentioned time-to-digital converter 1122 and the accumulating circuit 1126, the detailed description is omitted here for brevity. In addition, both the time-to-digital converter 5142 and an adjusting circuit 5144 are also digital based circuits.

Briefly, the method of estimating the gain $K_{v2}$ of the controllable oscillator 508 in the phase-locked loop circuit 500 can be summarized into the following steps S502-S508:

Step S502: Arrange the detecting circuit 502 to receive the reference clock signal Sr2 and the feedback oscillating signal Sfb2 and generate the first detect signal Sd1 according to the reference clock signal Sr2 and the feedback oscillating signal Sfb2;

Step S504: Arrange the auxiliary circuit 504 to adjust the first detect signal Sd1 according to the first input signal Si2 to generate the adjusted detect signal Sad1;

Step S506: Arrange the low-pass filter 506 to generate the first control signal Scc3 according to the adjusted detect signal Sad1;

Step S508: Arrange the controllable oscillator 508 to generate the output oscillating signal So2 according to the first control signal Scc3;

Step S510: Arrange the feedback circuit 510 to generate the feedback oscillating signal Sfb2 according to the output oscillating signal So2 and the second control signal Scc4;

Step S512: Arrange the sigma-delta modulator 512 to generate the second control signal Scc4 according to the second input signal Sil3; and Step S514: Detect the difference Td2 between the reference clock signal Sr2 and the feedback oscillating signal Sfb2 to generate the detecting signal utilized for estimating the gain $K_{v2}$ of the controllable oscillator 508.

Figure 6:
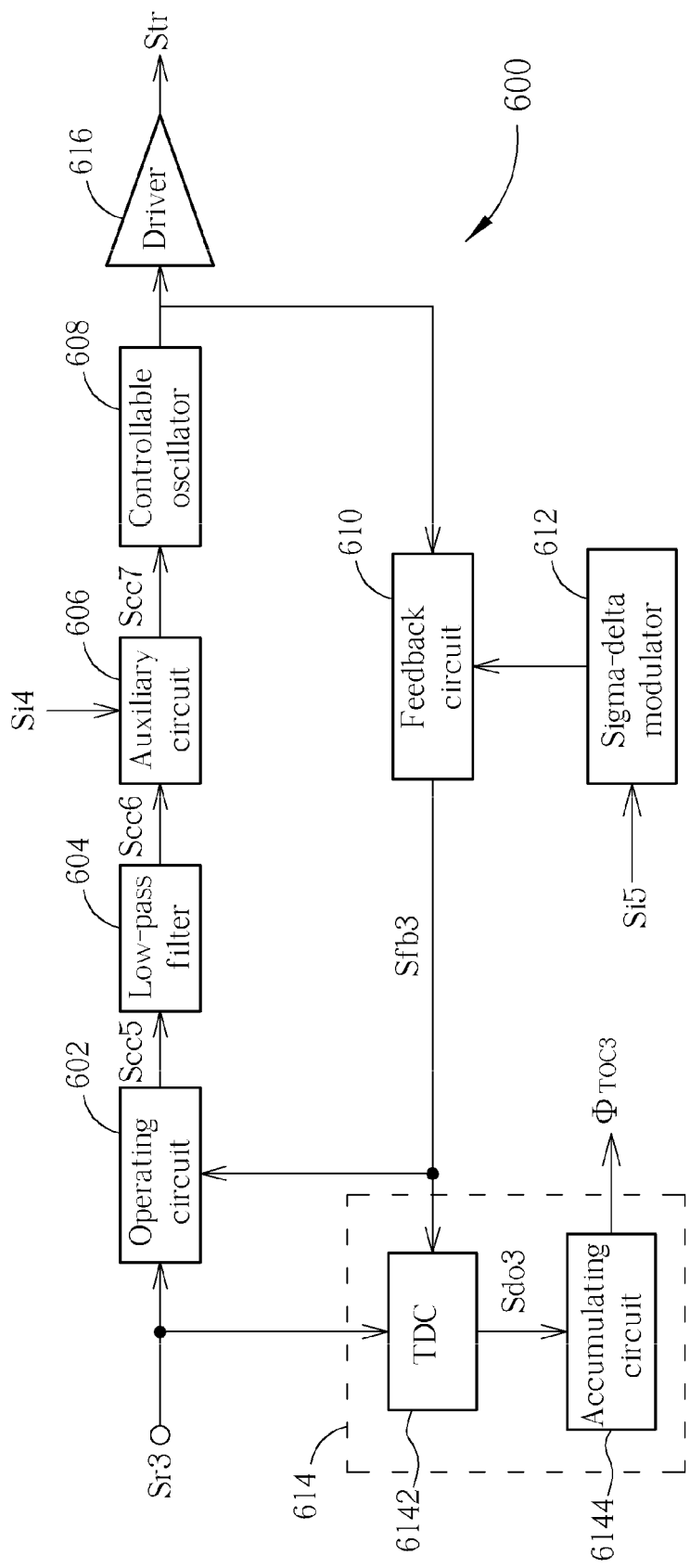
FIG. 6 is a diagram illustrating a phase-locked loop circuit according to a fourth embodiment of the present invention.

FIG. 6 is a diagram illustrating a phase-locked loop circuit 600 according to a fourth embodiment of the present invention. The phase-locked loop circuit 600 comprises an operating circuit 602, a low-pass filter 604, an auxiliary circuit 606, a controllable oscillator 608, a feedback circuit 610, a sigma-delta modulator 612, a detecting circuit 614, and a driver 616. The operating circuit 602, which can be a phase/frequency detector and a charge pump circuit (PFD/CP), is arranged to receive a reference clock signal Sr3 and a feedback oscillating signal Sfb3 and generate a first control signal Scc5 according to the reference clock signal Sr3 and the feedback oscillating signal Sfb3. The low-pass filter 604 is arranged to filter out the unwanted signal of the first control signal Scc5 to generate a low-pass control signal Scc6. The auxiliary circuit 606 is arranged to adjust the low-pass control signal Scc6 according to a first input signal Si4 to generate an adjusted control signal Scc7. The controllable oscillator 608 is arranged to generate an output oscillating signal So3 according to the adjusted control signal Scc7. The feedback circuit 610, which can be a frequency divider, is arranged to generate the feedback oscillating signal Sfb3 according to the output oscillating signal So3 and a second control signal Scc8. The sigma-delta modulator 612 is arranged to generate the second control signal Scc8 according to a second input signal Si5. The detecting circuit 614 is arranged to detect a difference Td3 between the reference clock signal Sr3 and the feedback oscillating signal Sfb3 to generate a detecting signal utilized for estimating a gain $K_{v3}$ of the controllable oscillator 608, in which the difference Td3 is the time difference caused by the phase difference between the reference clock signal Sr3 and the feedback oscillating signal Sfb3.

In addition, the detecting circuit 614 comprises a time-to-digital converter (TDC) 6142 and an accumulating circuit 6144. The time-to-digital converter 6142 is arranged to convert the difference Td3 to a digital represented value Sdo3. The accumulating circuit 6144 is arranged to accumulate the digital represented value Sdo3 outputted from the time-to-digital converter 6142 to generate an accumulated digital represented value $\phi_{TDC3}$, i.e., the above-mentioned detecting signal.

When the phase-locked loop circuit 600 is enabled, the phase-locked loop circuit 600 locks the phases of the reference clock signal Sr3 and the feedback oscillating signal Sfb3 to generate the output oscillating signal So3 according to the second input signal Si5. Then, when the phase-locked loop circuit 600 is stable, a testing signal (i.e., the first input signal Si4) is generated to be input to the auxiliary circuit 606 for estimating the gain $K_{v3}$ of the controllable oscillator 608. It should be noted that the first input signal Si4 is a step signal represented in digital, and the first input signal Si4 is represented by a frequency step Δf3. Once the first input signal Si4 is inputted to the auxiliary circuit 606, the voltage level of the adjusted control signal Scc7 is updated accordingly. Similarly, the phase (or the frequency) of the output oscillating signal So3 and the feedback oscillating signal Sfb3 are updated. Then, the phase-locked loop circuit 600 re-locks the phases of the reference clock signal Sr3 and the feedback oscillating signal Sfb3 to update the output oscillating signal So3. In other words, the accumulated digital represented value $\phi_{TDC3}$ includes the information of the gain $K_{v3}$ of the controllable oscillator 608. It should be noted that the first input signal Si4 is a known voltage signal in this preferred embodiment. Therefore, the gain $K_{v3}$ of the controllable oscillator 608 can be obtained according to the first input signal Si4 and the accumulated digital represented value $\phi_{TDC3}$.

According to the teachings of the third preferred embodiment, when the gain $K_{v3}$ of the controllable oscillator 608 is obtained, the loop gain of the phase-locked loop circuit 600 is also obtained. Then, if the gain mismatch of the controllable oscillator 606 occurs to make the loop gain of the phase-locked loop circuit 600 deviate from the desired value, the loop gain of the phase-locked loop circuit 600 can be calibrated to the desired value according to the accumulated digital represented value $\phi_{TDC3}$ and the first input signal Si4. Similarly, the preferred embodiment is not limited to the way of calibrating the loop gain of the phase-locked loop circuit 600. For example, in one embodiment of the present invention, a calibrating circuit can be used to receive the accumulated digital represented value $\phi_{TDC3}$ and the first input signal Si4 and accordingly generate a calibrating signal to adjust the gain of the operating circuit 602 or the gain of the low-pass filter 604 for calibrating the loop gain of the phase-locked loop circuit 600. As the operation of the time-to-digital converter 6142 and the accumulating circuit 6144 are similar to the above-mentioned time-to-digital converter 1122 and the accumulating circuit 1126, the detailed description is omitted here for brevity. In addition, both the time-to-digital converter 6142 and an adjusting circuit 6144 are also digital based circuits.

Briefly, the method of estimating the gain $K_{v3}$ of the controllable oscillator 608 in the phase-locked loop circuit 600 can be summarized into the following steps S602-S608:

Step S602: Arrange the operating circuit 602 to receive the reference clock signal Sr3 and the feedback oscillating signal Sfb3 and generate the first control signal Scc5 according to the reference clock signal Sr3 and the feedback oscillating signal Sfb3;

Step S604: Arrange the auxiliary circuit 606 to adjust the first control signal Scc5 according to the first input signal Si4 to generate the adjusted control signal Scc7;

Step S606: Arrange the controllable oscillator 608 to generate the output oscillating signal So3 according to the adjusted control signal Scc7;

Step S608: Arrange the feedback circuit 610 to generate the feedback oscillating signal Sfb3 according to the output oscillating signal So3 and the second control signal Scc8;

Step S610: Arrange the sigma-delta modulator 612 to generate the second control signal Scc8 according to the second input signal Sil5; and Step S612: Detect the difference Td3 between the reference clock signal Sr3 and the feedback oscillating signal Sfb3 to generate the detecting signal utilized for estimating the gain $K_{v3}$ of the controllable oscillator 608.

In conclusion, the embodiments of the present invention uses the digital circuit of detecting circuit (e.g., the time-to-digital converter) to detect the time difference between the reference clock signal and the feedback oscillating signal in the phase-locked loop circuit by inputting a testing signal after the phase-locked loop circuit is stable. Then, the gain mismatch of the controllable oscillator in the phase-locked loop circuit can be deduced according to the information in the detected time difference. Then, the gain mismatch of the controllable oscillator can be calibrated by adjusting one of the gains of the controllable oscillator, the PFD/CP circuit, and the low-pass filter in phase-locked loop circuit. Furthermore, as the detecting circuit is implemented by the digital circuit, the area occupied by the detecting circuit is smaller than the counterpart of the analog circuit. Moreover, the digital circuit is also adapted to different semiconductor manufacturing processes.

Those skilled in the art will readily observe that numerous modifications and alterations of the device and method may be made while retaining the teachings of the invention.

What is claimed is:

1. A signal generating circuit, comprising:
   an operating circuit, arranged to generate a first control signal according to a reference clock signal and a feedback oscillating signal;
   a controllable oscillator, arranged to generate an output oscillating signal according to the first control signal and a second control signal;
   a feedback circuit, arranged to generate the feedback oscillating signal according to the output oscillating signal and a third control signal;
   a control circuit, arranged to generate the second control signal and the third control signal according to an input signal; and
   a calibrating circuit, arranged to calibrate the control circuit to adjust the second control signal by detecting a phase difference between the reference clock signal and the feedback oscillating signal.

2. The signal generating circuit of claim 1, wherein the input signal is a step signal represented in digital.

3. The signal generating circuit of claim 1, wherein the control circuit comprises:
   a sigma-delta modulator, arranged to generate the third control signal according to the input signal; and
   a converting circuit, arranged to generate the second control signal according to the input signal; and
   the calibrating circuit comprises:
   a time-to-digital converter (TDC), arranged to convert the phase difference between the reference clock signal and the feedback oscillating signal to a digital represented value; and
   an adjusting circuit, arranged to adjust a gain of the converting circuit according to the digital represented value so as to calibrate the control circuit.

4. The signal generating circuit of claim 3, wherein the adjusting circuit comprises:
   an accumulating circuit, arranged to accumulate an output of the TDC to generate an accumulated result;
   a moving average circuit, arranged to perform a moving average operation upon the accumulated result to generate an averaged result; and
   a successive approximation register (SAR) calibrating unit, arranged to generate a calibrating signal to the converting circuit for successively adjusting the second control signal according to the averaged result.

5. The signal generating circuit of claim 3, wherein the converting circuit comprises:
   a digital-to-analog converter (DAC), arranged to convert the input signal into the second control signal; and
   a gain adjustable circuit, arranged to provide an adjustable gain controlled by the adjusting circuit.

6. The signal generating circuit of claim 1, being a two-point modulator (TPM).

7. A signal generating circuit, comprising:
   an operating circuit, arranged to generate a first control signal according to a reference clock signal and a feedback oscillating signal;
   a controllable oscillator, arranged to generate an output oscillating signal according to the first control signal;
   a feedback circuit, arranged to generate the feedback oscillating signal according to the output oscillating signal and a second control signal;
   a sigma-delta modulator, arranged to generate the second control signal; and
   a first detecting circuit, arranged to detect a phase difference between the reference clock signal and the feedback oscillating signal to generate a first detecting signal utilized for estimating a gain of the controllable oscillator when an input signal is inputted to the signal generating circuit.

8. The signal generating circuit of claim 7, wherein the input signal is a step signal represented in digital.

9. The signal generating circuit of claim 7, wherein the input signal is inputted to the sigma-delta modulator.

10. The signal generating circuit of claim 7, wherein the first detecting circuit comprises:
    a time-to-digital converter (TDC), arranged to convert the phase difference to a digital represented value utilized for estimating the gain of the controllable oscillator.

11. The signal generating circuit of claim 7, wherein the operating circuit comprises:
    a second detecting circuit, arranged to detect the reference clock signal and the feedback oscillating signal to generate a second detect signal;
    an auxiliary circuit, arranged to adjust the second detect signal according to the input signal to generate an adjusted detect signal; and
    a filter, arranged to generate the first control signal according to the adjusted detect signal.

12. The signal generating circuit of claim 11, wherein the input signal is a current signal.

13. The signal generating circuit of claim 7, further comprising:
    an auxiliary circuit, arranged to adjust the first control signal according to the input signal to generate an adjusted control signal;
    wherein the controllable oscillator is arranged to generate the output oscillating signal according to the adjusted control signal.

14. The signal generating circuit of claim 13, wherein the input signal is a voltage signal.

15. A device for estimating a gain of a controllable oscillator operated in a phase locked loop (PLL), the device comprising:
    a testing signal generator, arranged to inject a testing signal into the phase locked loop; and
    a time-to-digital converter (TDC), arranged to convert a phase difference between a reference clock signal and a feedback oscillating signal of the phase locked loop to a digital represented value for estimating the gain of the controllable oscillator, wherein the reference clock signal and the feedback oscillating signal are derived after the injection of the testing signal.

16. The device of claim 15, wherein the PLL comprises:
    an operating circuit, arranged to generate a first control signal according to the reference clock signal and the feedback oscillating signal;
    the controllable oscillator, arranged to generate an output oscillating signal according to the first control signal; and
    a feedback circuit, arranged to generate the feedback oscillating signal according to the output oscillating signal and a second control signal.

17. The device of claim 16, wherein the testing signal is a step signal represented in digital injected through a sigma-delta modulator coupled to the feedback circuit, or a current signal injected between a detecting circuit and a filter of the operating circuit, or a voltage signal injected between the operating circuit and the controllable oscillator.

18. The device of claim 15, further comprising:
an accumulating circuit, arranged to accumulate the digital represented value to generate an accumulated result for estimating the gain of the controllable oscillator.

19. The device of claim 15, being utilized to calibrate the gain of the controllable oscillator, further comprising:
a sigma-delta modulator, coupled to a feedback circuit of the PLL;
a converting circuit, coupled to the controllable oscillator of the PLL, wherein the testing signal is injected into the PLL through the sigma-delta modulator and the converting circuit; and
an adjusting circuit, arranged to adjust a gain of the converting circuit according to the digital represented value so as to calibrate the gain of the controllable oscillator.

20. The device of claim 19, wherein the adjusting circuit comprises:
an accumulating circuit, arranged to accumulate the digital represented value to generate an accumulated result;
a moving average circuit, arranged to perform a moving average operation upon the accumulated result to generate an averaged result; and
a successive approximation register (SAR) calibrating unit, arranged to generate a calibrating signal to the converting circuit for successively adjusting the gain of the converting circuit according to the averaged result.

21. The device of claim 15, wherein the PLL is a two-point modulator (TPM).

22. A method for estimating a gain of a controllable oscillator operated in a phase locked loop (PLL), the method comprising the steps of:
injecting a testing signal into the phase locked loop; and
converting a phase difference between a reference clock signal and a feedback oscillating signal of the phase locked loop to a digital represented value for estimating the gain of the controllable oscillator, wherein the reference clock signal and the feedback oscillating signal are derived after the injection of the testing signal.

23. The method of claim 22, wherein the testing signal is a step signal represented in digital, or a current signal, or a voltage signal.

24. The method of claim 22, further comprising:
accumulating the digital represented value to generate an accumulated result for estimating the gain of the controllable oscillator.

25. The method of claim 22, wherein a converting circuit is coupled to the controllable oscillator, and the testing signal is injected into the PLL through the converting circuit, the method further comprises:
adjusting a gain of the converting circuit according to the digital represented value so as to calibrate the gain of the controllable oscillator.

26. The method of claim 25, wherein the step of adjusting the gain of the converting circuit comprises:
accumulating the digital represented value to generate an accumulated result;
performing a moving average operation upon the accumulated result to generate an averaged result; and
generating a calibrating signal to the converting circuit for successively adjusting the gain of the converting circuit according to the averaged result.

27. The method of claim 22, wherein the PLL is a two-point modulator (TPM).

* * * * *